Figure 1:
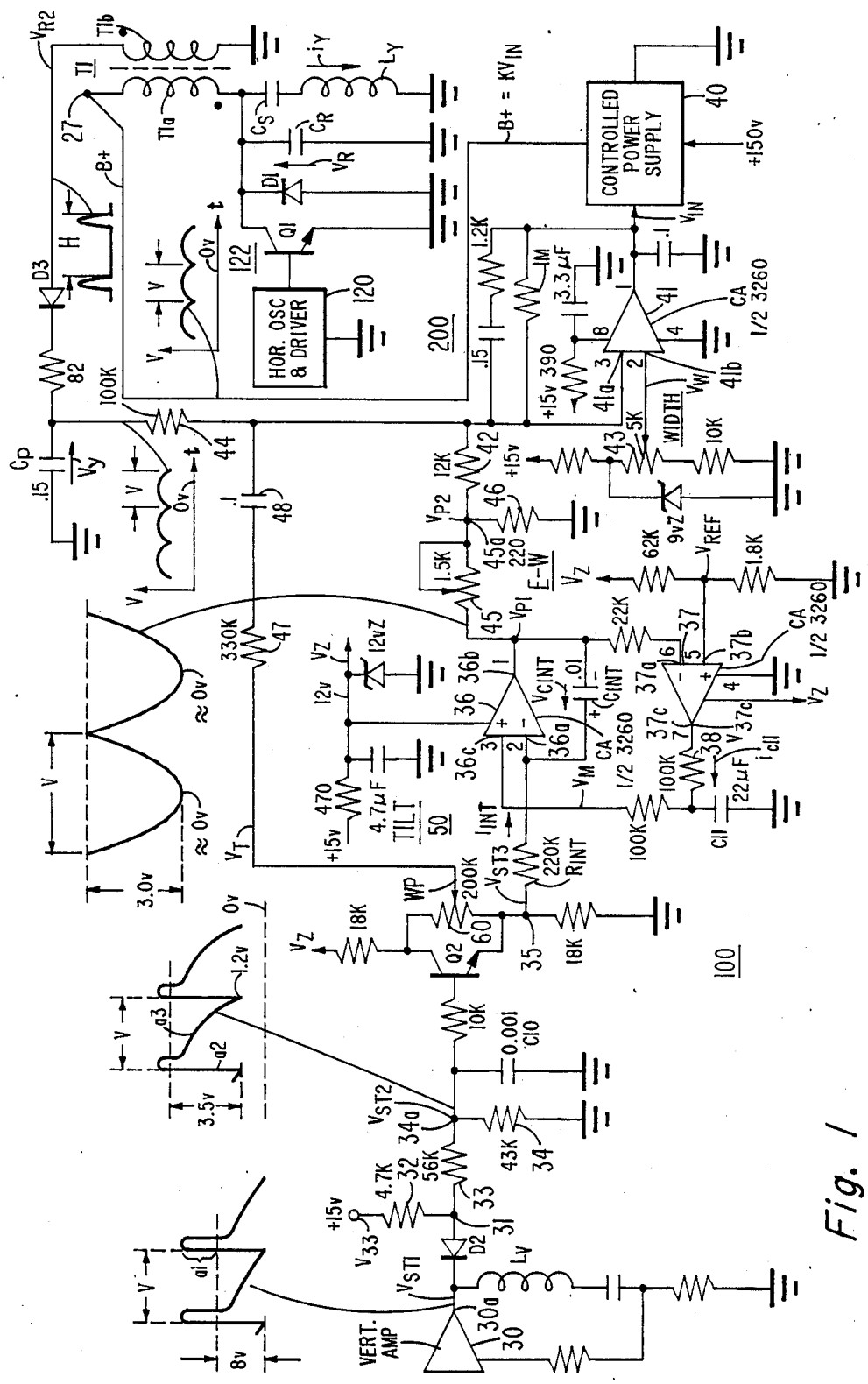

United States Patent [19]
Dietz

[11] Patent Number: 4,675,580
[45] Date of Patent: Jun. 23, 1987

[54] PARABOLIC VOLTAGE GENERATING CIRCUIT

[75] Inventor: Wolfgang F. W. Dietz, New Hope, Pa.

[73] Assignee: RCA Corporation, Princeton, N.J.

[21] Appl. No.: 781,632

[22] Filed: Sep. 30, 1985

[51] Int. Cl.[4] .................. H01J 29/56; H01J 29/72; G06G 7/186
[52] U.S. Cl. .................................. 315/371; 328/127; 315/387
[58] Field of Search .............. 315/371, 370, 408, 411, 315/387, 388, 389; 328/127

[56] References Cited

U.S. PATENT DOCUMENTS 3,543,080 11/1970 Wuensch ............................. 315/371
3,715,487 2/1973 Blake .................................. 328/127
4,064,406 12/1977 Tiemeijer ............................ 315/371

Primary Examiner—Theodore M. Blum
Assistant Examiner—Gregory C. Issing
Attorney, Agent, or Firm—Eugene M. Whitacre; Joseph J. Laks; Sammy S. Henig

[57] ABSTRACT

A vertical rate parabolic voltage at a peak-to-peak amplitude that is adjustable is generated in an integrator from a sawtooth input voltage. The parabolic voltage at an output terminal of the integrator is applied to a source of a B+ operating voltage to form a parabolic component voltage of the B+ operating voltage that controls the amplitude of a trace current in a horizontal deflection circuit output stage. The parabolic voltage is adjusted in peak-to-peak amplitude to provide east-west pincushion correction of the raster. The minimum level of the parabolic voltage in each vertical period is automatically maintained at an unchanged level that is approximately zero volts throughout the range of east-west adjustment. Because the minimum level of the parabolic voltage remains unchanged, the maximum level of the B+ operating voltage, a level that occurs in the center of each vertical interval, also remains unchanged throughout the range of east-west adjustment. In this way, the width of the raster is unaffected by adjustment of the peak-to-peak amplitude of the parabolic component voltage of the B+ operating voltage.

20 Claims, 4 Drawing Figures

PARABOLIC VOLTAGE GENERATING CIRCUIT

The invention relates to a television circuit that generates a parabolic waveform at a frequency that is related to a deflection frequency.

In a television receiver, the electron beams inside the television receiver picture tube are deflected by magnetic fields generated by sawtooth deflection currents flowing in horizontal and vertical deflection windings. The deflected electron beams scan a raster pattern on the picture tube phosphor screen. The raster pattern, without correction, may display various geometric distortions such as side or east-west pincushion distortion and top and bottom or north-south pincushion distortion.

To correct, for example, side pincushion distortion, the peak-to-peak horizontal deflection trace current in the horizontal deflection winding is modulated at a vertical rate in a parabolic manner. Such parabolic modulation may be accomplished by a modulator circuit, coupled to the horizontal deflection circuit output stage.

In a typical horizontal deflection circuit output stage, a deflection trace capacitor is coupled to a deflection winding. The trace capacitor is charged from a B+ operating voltage supply through a flyback transformer primary winding. A deflection switch is provided in order to generate horizontal rate sawtooth current in the deflection winding. During horizontal retrace, the horizontal deflection winding resonates with a retrace capacitor for providing fly back of the sawtooth current.

A well known way of modulating the trace current at a vertical rate in a parabolic manner is summing up a vertical rate voltage that is substantially parabolic with a DC voltage to provide the B+ operating voltage. In such an arrangement, the B+ operating voltage includes a vertical rate substantially parabolic component voltage and a DC component voltage. At the vertical center of the raster, the B+ operating voltage is at a maximum; whereas at the top and bottom, it is at a minimum. As a result, trace voltage across the trace capacitor varies in a parabolic manner, thereby providing side pincushion correction.

A television receiver may be provided with, for example, an adjustable resistor for controlling the amplitude of the horizontal deflection current. This adjustable resistor is generally referred to as the width control. Raster width adjustment is accomplished using the width control to obtain, at the vertical center of the raster, the required amplitude of the deflection current. In the arrangement that was discussed above, the width control may control the raster width by controlling the DC component voltage of the B+ operating voltage.

Another adjustment that may be included in a television receiver is the adjustment of the peak-to-peak amplitude of a parabolic voltage that provides pincushion distortion correction that was discussed above. The extent of, for example, east-west modulation is determined by the peak-to-peak amplitude of the substantially parabolic component voltage that is part of the B+ operating voltage. The width of the raster is determined by the level of the B+ operating voltage at the vertical center of the screen. The maximum level of the parabolic component voltage that occurs at the vertical center determines the width of the raster.

In accordance with a feature of the invention, in order to simplify the adjustment of the width of the raster and the pincushion distortion correction, it may be desirable, to vary, or adjust, the peak-to-peak amplitude of the parabolic component voltage for obtaining the required pincushion distortion correction without affecting, by such adjustment, the raster width. In this way, there is no need to readjust the width control after adjusting the parabolic component voltage that provides pincushion distortion correction.

In carrying out an aspect of the invention, the peak level of the B+ operating voltage that occurs at the vertical center is automatically maintained constant when the peak-to-peak amplitude of the parabolic component voltage thereof is adjusted to obtain pincushion distortion correction.

In accordance with an aspect of the invention, a television apparatus generates a periodic parabolic voltage having a period that is related to a deflection frequency. A source of a reference voltage is provided. A control signal is generated in accordance with the difference between the parabolic and reference voltages. The control signal maintains the level of the parabolic voltage that occurs during a predetermined portion of the period of the parabolic voltage, at a level that is determined by the reference voltage. When a change in the amplitude of the parabolic voltage occurs, such as, for example, in the peak-to-peak amplitude of the parabolic voltage, the control signal automatically maintains the parabolic voltage that occurs during the predetermined portion of the period at the same level.

In carrying out another aspect of the invention, the parabolic voltage is at a vertical rate and has an adjustable peak-to-peak amplitude that provides raster distortion correction. After adjusting the peak-to-peak amplitude of the parabolic voltage, the control signal automatically maintains the minimum level of the parabolic voltage in each vertical period at substantially the same level in accordance with the level of the reference voltage. In this way, the control signal maintains the raster width unchanged.

In carrying out yet another aspect of the invention, the parabolic voltage is applied to a source that generates therefrom the B+ operating voltage for forming a substantially parabolic voltage component of the B+ operating voltage. The B+ operating voltage is coupled to a deflection circuit output stage for varying the amplitude of the trace current in a deflection winding in a parabolic manner to obtain pincushion distortion correction. The instantaneous level of the parabolic component voltage of the B+ operating voltage is determined by the instantaneous level of the waveform of the parabolic voltage. In each vertical period, the maximum level of the B+ operating voltage occurs when the minimum level of the parabolic voltage occurs. By automatically maintaining the minimum level of the parabolic voltage at the same level when the peak-to-peak amplitude of the parabolic voltage varies or is adjusted, the maximum level of the B+ operating voltage is automatically maintained at the same level. Thus, the maximum level of the B+ operating voltage is independent of the peak-to-peak amplitude of the adjustable parabolic voltage component. Therefore, at the vertical center of the raster, the amplitude of the horizontal trace current is the same irrespective of the amplitude of the adjustable parabolic component voltage. The width of the raster will remain unchanged after the peak-topeak amplitude of the parabolic component voltage is adjusted.

Figure 2:
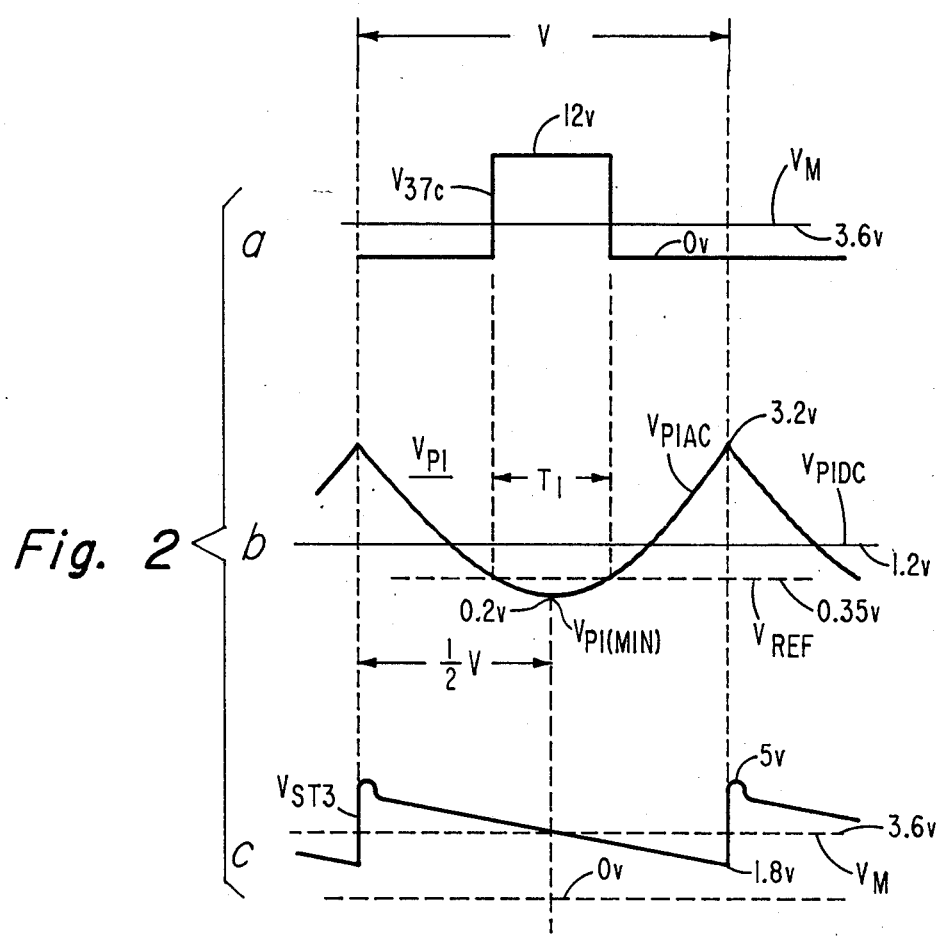

FIG. 1 illustrates a parabolic waveform generating circuit, embodying the invention, that provides east-west correction in a deflection circuit output stage; and FIGS. 2a–2c illustrate waveforms useful in explaining the operation of the circuit of FIG. 1.

FIG. 1 illustrates a horizontal deflection circuit 122 including a modulating circuit 200 that provides side pincushion distortion correction by modulating, at a vertical rate in a parabolic manner, a horizontal deflection current $i_y$ in deflection circuit 122. Conventionally designed horizontal deflection circuit 122 includes a deflection trace capacitor $C_S$ that is coupled to a horizontal deflection winding $L_Y$. Trace capacitor $C_S$ is charged from a B+ operating voltage that is produced by a supply 40 of modulator circuit 200. The B+ operating voltage is coupled to a terminal 27 of a primary winding T1a of a flyback transformer T1 of deflection circuit 122. A deflection switch Q1 is provided in order to generate horizontal rate sawtooth current $i_Y$ in deflection winding $L_Y$. During horizontal retrace, horizontal deflection winding $L_Y$ resonates with a retrace capacitor $C_R$ for providing flyback of the sawtooth current $i_Y$. Deflection switch Q1 is controlled by a horizontal oscillator and driver unit 120 that is conventionally designed. The instantaneous value of the B+ operating voltage is controlled, in power supply 40, by an input signal $V_{IN}$. The operation of supply 40 is such that the B+ operating voltage is equal to input voltage $V_{IN}$ multiplied by, illustratively, a substantially constant positive factor K. Power supply 40 that is conventionally designed may include a switch mode power supply circuitry using pulse width modulation principles, or a series pass transistor operated in the Class A mode.

Modulating circuit 200 controls deflection current $i_Y$ in deflection winding $L_Y$ by controlling the instantaneous level of signal $V_{IN}$ that controls the instantaneous level of the B+ operating voltage. Modulating circuit 200 causes deflection current $i_Y$, having a sawtooth waveform, to have a peak-to-peak amplitude that is directly proportional in each horizontal period to the algebraic sum of the levels, during such horizontal period, of a vertical rate parabolic voltage $V_{P2}$, a width control voltage $V_W$ and a vertical rate tilt control voltage $V_T$, as described later on. In such algebraic sum, the terms representing each of voltage $V_{P2}$ and $V_T$ are multiplied by minus 1 prior to such summation. Tilt control signal $V_T$ is capacitively coupled to an inverting input terminal 41a of an amplifier 41 of modulating circuit 200. Signal $V_T$ having a substantially sawtooth waveform controls the tilt of the raster on a television screen that is not shown in the figures. Parabolic voltage $V_{P2}$ that provides east-west pincushion correction is coupled through a resistor 42 to terminal 41a that operates as a current summing junction. Width control signal $V_W$, that is a DC voltage, is adjustable by varying a variable resistor 43. Signal $V_W$ is coupled to a noninverting input terminal 41b of amplifier 41 for controlling the width of the raster by controlling the amplitude of the deflection current at the vertical center of the raster.

A horizontal rate retrace voltage $V_{R2}$ that is developed at a secondary winding T1b of flyback transformer T1 has a peak amplitude that is proportional to the magnitude of deflection current $i_Y$ in deflection winding $L_Y$. Retrace voltage $V_{R2}$ is rectified by a diode D3 to develop, in a capacitor $C_P$, a DC voltage $V_Y$ that is proportional to the peak voltage of retrace voltage $V_{R2}$. Thus, voltage $V_Y$ is proportional to the amplitude of deflection current $i_Y$. Voltage $V_Y$ is coupled through a resistor 44 to current summing terminal 41a to provide a negative feedback signal path. As a result of such conventional negative feedback, deflection current $i_Y$ is controlled to be directly proportional to the algebraic sum of voltages $V_T$, $V_{P2}$ and $V_W$, as defined before.

Parabolic voltage $V_{P2}$ is formed from a parabolic voltage $V_{P1}$ that is generated by a parabolic voltage generating circuit 100. The waveform of voltage $V_{P1}$ is illustrated in FIG. 2b. Parabolic voltage $V_{P1}$, that is at the vertical rate, has, during each vertical period, a minimum level $V_{P1(MIN)}$, at the center of the vertical interval. Level $V_{P1(MIN)}$ is substantially zero, as described later on. Parabolic voltage $V_{P1}$ of FIG. 1 is coupled to an end terminal of a variable resistor 45. The other end terminal of resistor 45 is coupled at a junction terminal 45a to a resistor 46. The other terminal of resistor 46 is coupled to ground. Parabolic voltage $V_{P2}$, having a peak-to-peak amplitude that is adjustable by adjusting resistor 45, is developed at terminal 45a.

Because parabolic voltage $V_{P1}$ has minimum level $V_{P1(MIN)}$ of FIG. 2b that is advantageously approximately zero volts, as indicated before, the adjustment of resistor 45 of FIG. 1 will cause corresponding adjustment of the peak-to-peak amplitude of parabolic voltage $V_{P2}$ without substantially affecting the minimum level of parabolic voltage $V_{P2}$. This is so because resistors 45 and 46 operate as a linear voltage divider that multiplies parabolic voltage $V_{P1}$ by an adjustable constant factor to generate voltage $V_{P2}$. Since the minimum level of parabolic voltage $V_{P1}$ is approximately zero, the minimum level of parabolic voltage $V_{P2}$, that is equal to parabolic voltage $V_{P1}$ after multiplication by such constant is also zero.

Because of voltage inversion in amplifier 41, when the level of parabolic voltage $V_{P2}$ is at a minimum, that is zero volts, both signal $V_{IN}$ and the B+ operating voltage are at corresponding maximum. The advantageous result is that, the peak-to-peak amplitude of deflection current $i_Y$ at the center of the vertical interval that is controlled by the maximum level of the B+ operating voltage, is the same, irrespective of the peak-to-peak amplitude of parabolic voltage $V_{P2}$.

In carrying out an aspect of the invention, adjusting the peak-to-peak amplitude of parabolic voltage $V_{P2}$ to provide the required pincushion raster correction will not affect the raster width that is related to the maximum peak-to-peak amplitude of deflection current $i_Y$. The maximum peak-to-peak amplitude of the deflection current $i_Y$ occurs at the vertical center of the raster that occurs when parabolic voltage $V_{P2}$ is at a minimum.

FIG. 1 also illustrates parabolic waveform generating circuit 100 embodying aspects of the invention, that generates parabolic voltage $V_{P1}$. A DC positive signal $V_{ST1}$ that contains a substantially sawtooth waveform varying at the vertical rate is produced at an output terminal 30a of a vertical amplifier 30. Vertical amplifier 30 comprises a conventionally designed vertical deflection amplifier that generates a vertical deflection current in a vertical deflection winding $L_V$. Signal $V_{ST1}$ is coupled to a cathode of a diode D2. The anode of diode D2 is coupled to a junction terminal 31 that is coupled between a resistor 32 and a resistor 33. The other terminal of resistor 32 is coupled to a DC voltage $V_{33}$ that is, illustratively, 15 volts. The other terminal of resistor 33 is coupled through a resistor 34 to ground.

The DC voltage that is developed at terminal 31 by the voltage divider formed of resistors 32, 33 and 34 establishes a clipping voltage level as described below. A capacitor C10 is coupled between terminal 34a and ground for filtering out from signal $V_{ST2}$ signals at the horizontal frequency and above.

Each tip a1 of signal $V_{ST1}$, that is shown in the waveform in the FIG. 1 that is developed at terminal 30a, is formed during the vertical retrace interval. When signal $V_{ST1}$ exceeds such clipping voltage level, diode D2 is back biased so that a portion of each positive tip a1 of signal $V_{ST1}$ is not coupled to terminal 31. Conversely, when signal $V_{ST1}$ is below such clipping level, signal $V_{ST1}$ is coupled in its entirety to terminal 31 to form a DC, positive, substantially sawtooth signal $V_{ST2}$ at terminal 34a that follows the waveform of signal $V_{ST1}$. Thus, signal $V_{ST2}$ is a DC voltage having a sawtooth waveform at a vertical rate. Signal $V_{ST2}$ has a fast rising edge portion a2 that occurs during vertical retrace and a slow down-ramping portion a3 having a rate of change that increases gradually from the beginning to the end of vertical trace.

Signal $V_{ST2}$ is coupled to the base electrode of a transistor Q2 that operates as an emitter follower. The emitter electrode of transistor Q2 couples signal $V_{ST2}$ to a terminal 35 of an input resistor $R_{INT}$ of an integrator 50 to form a DC positive input signal $V_{ST3}$ at terminal 35 having a waveform that is illustrated in FIG. 2c. Signal $V_{ST3}$ of FIG. 1 substantially follows the waveform of signal $V_{ST2}$, except for the DC level shifting caused by the base-emitter junction of transistor Q2.

Signal $V_{ST3}$ is applied to resistor $R_{INT}$ that generates from signal $V_{ST3}$ an alternating current (AC) input current $i_{INT}$ in resistor $R_{INT}$. The other terminal of resistor $R_{INT}$ is coupled to an inverting input terminal 36a of an amplifier 36 of integrator 50. An integrating capacitor $C_{INT}$ is coupled between an output terminal 36b of amplifier 36 and inverting input terminal 36a. A noninverting input terminal 36c of amplifier 36 is coupled to a control signal $V_M$, as described later on. Capacitor $C_{INT}$, resistor $R_{INT}$ and amplifier 36 form integrator 50 that generates parabolic voltage $V_{P1}$ at output terminal 36b by time-integrating AC input current $i_{INT}$, having a sawtooth waveform, to develop a voltage $V_{CINT}$ in capacitor $C_{INT}$.

An inverting input terminal 37a of a feedback amplifier 37 that operates as a voltage comparator is coupled to output terminal 36b of amplifier 36. A noninverting input terminal 37b of amplifier 37 is coupled to an, illustratively, positive constant DC reference voltage $V_{REF}$ that is close to zero volts. Voltage $V_{REF}$ determines, as described later on, the minimum level of parabolic voltage $V_{P1}$.

An output terminal 37c of amplifier 37 develops a relatively large positive first control signal that is referred to as voltage $V_{37c}$, having a waveform that is illustrated in FIG. 2a, when voltage $V_{P1}$ of FIG. 2b that is coupled to terminal 37a, is less positive than reference voltage $V_{REF}$; conversely, amplifier 37 of FIG. 1 develops zero volts at terminal 37a as illustrated in FIG. 2a when voltage $V_{P1}$ of FIG. 2b is more positive than reference voltage $V_{REF}$. A resistor 38 of FIG. 1 is coupled between voltage $V_{37c}$ and a plate of a capacitor C11. The other plate of capacitor C11 is at ground potential. The voltage in capacitor C11 is coupled to noninverting input terminal 36c of amplifier 36 to form second control signal $V_M$ that is substantially equal to the voltage in capacitor C11. Because the time constant of resistor 38 and capacitor C11 is substantially larger than the vertical period, control signal $V_M$ that is equal to the voltage in capacitor C11 cannot vary significantly within each vertical period.

Assume, for the purpose of the analysis of parabolic voltage generating circuit 100, that the offset voltages and bias currents of amplifiers 36 and 37 are all zero and that the gain and the bandwidth of each is infinite. The average value of current $i_{INT}$ has to be zero; otherwise, voltage $V_{CINT}$ in capacitor $C_{INT}$ would increase in magnitude indefinitely. Therefore, in steady state, a voltage $V_{36a}$ at inverting input terminal 36a has an average value that is equal to the average value of DC positive signal $V_{ST3}$ at terminal 35. Because of the negative feedback signal path formed by capacitor $C_{INT}$ from output terminal 36b to input terminal 36a of amplifier 36, voltage $V_{36a}$ at terminal 36a is also equal to the voltage of signal $V_M$ at terminal 36c. It follows that, in steady state, the average value of signal $V_M$ is maintained constant and equal to the average value of signal $V_{ST3}$. Signal $V_M$ is maintained constant by the feedback path from output terminal 36b of amplifier 36 via amplifier 37 to noninverting input terminal 36c of amplifier 36.

In an example of parabolic voltage $V_{P1}$, shown in FIG. 2b, a portion $T_1$ of the vertical interval V is defined as the interval in which voltage $V_{P1}$ that is coupled to terminal 37a of amplifier 37 is less positive than reference voltage $V_{REF}$, that is shown in dashed-line in FIG. 2b. Note that the minimum level $V_{P1(MIN)}$ of parabolic voltage $V_{P1}$ occurs approximately at the center of portion $T_1$ that occurs at the center of the vertical interval V.

Amplifier 37 of FIG. 1 operates as a voltage comparator, of voltages $V_{P1}$ and $V_{REF}$. A positive current $i_{c11}$ of FIG. 1 occurs during portion $T_1$ of vertical interval V of FIG. 2b when parabolic voltage $V_{P1}$ is less positive than reference voltage $V_{REF}$. Positive current $i_{c11}$ is caused by the positive pulse of voltage $V_{37c}$ that is illustrated in FIG. 2a. In contrast, a negative current $i_{c11}$ occurs during the remainder of the vertical cycle when parabolic voltage $V_{P1}$ of FIG. 2b is more positive than reference voltage $V_{REF}$. When parabolic voltage $V_{P1}$ is more positive than reference voltage $V_{REF}$, voltage $V_{37c}$ of FIG. 2a of comparator, or amplifier 37 of FIG. 1 is zero. When voltage $V_{37c}$ is zero, negative current $i_{c11}$ discharges capacitor C11.

Because of the positive pulse of voltage $V_{37c}$ that occurs during portion $T_1$ of FIG. 2a, positive current $i_{c11}$ of FIG. 1 that flows in resistor 38 charges capacitor C11 during portion $T_1$ of FIG. 2a of vertical interval V. Negative current $i_{c11}$ discharges capacitor C11 during the remainder portions of vertical interval V of FIG. 2a. In steady state, signal $V_M$ of FIG. 1 is substantially constant and equal to the average value of signal $V_{ST3}$ as described before. It follows that, for example, during portion $T_1$ of vertical interval V, the charge added by positive current $i_{c11}$ has to be equal to the charge that is removed by negative current $i_{c11}$ during the remainder of interval V. Positive voltage $V_{37c}$ of FIG. 2a, that is large relative to the level of signal $V_M$ of FIG. 1, causes the flow of positive current $i_{c11}$ of FIG. 1. The result is that positive current $i_{c11}$ has a peak current that is substantially larger than that of negative current $i_{c11}$ that flows in resistor 38 when voltage $V_{37c}$ is zero.

Thus, in steady state operation, the duration of portion $T_1$ of FIG. 2b, during which the minimum level $V_{P1(MIN)}$ of parabolic voltage $V_{P1}$ occurs, is determined by the average value in each vertical period of positive current $i_{c11}$ relative to that of negative current $i_{c11}$. Positive current $i_{c11}$ that is large and that flows during portion $T_1$ has to replenish, during portion $T_1$, the same charge that was lost in capacitor C11 as a result of negative current $i_{c11}$ during the remainder of the vertical interval that is longer than portion $T_1$. In steady state, the average value of signal $V_M$ that is maintained substantially constant and as described before, is equal to the average value of signal $V_{ST3}$. It follows that in steady state, the ratio between the duration of portion $T_1$ to the remainder of the vertical interval V is directly related to a ratio RT between the average value of negative current $i_{c11}$ during portion $T_1$ to the average value of positive current $i_{c11}$ during the remainder of vertical interval V of FIG. 2a. Note that positive current $i_{c11}$ is substantially larger than that of negative current $i_{c11}$.

Voltage $V_{CINT}$ in capacitor $C_{INT}$ is the sum of an AC component voltage having a peak-to-peak amplitude that is determined by the peak-to-peak amplitude of signal $V_{ST3}$ and of a DC component voltage that is controlled by signal $V_M$, as described later on. Voltage $V_{P1}$ is equal to voltage $V_{36a}$, that is equal to signal $V_M$, minus voltage $V_{CINT}$. Thus, voltage $V_{P1}$ of FIG. 2b is equal to the sum of a DC component voltage $V_{P1DC}$ and an AC component voltage $V_{P1AC}$. Signal $V_M$ of FIG. 1 varies the level of DC component voltage $V_{P1DC}$ of FIG. 2b by causing the average value of voltage $V_{CINT}$ of FIG. 1 to vary, as described later on. As may be concluded by observing FIG. 2b, when DC component voltage $V_{P1DC}$ becomes, for example, more positive, the duration of portion $T_1$, that occurs when voltage $V_{P1}$ is less positive than voltage $V_{REF}$, decreases. On the other hand, when voltage $V_{P1DC}$ becomes less positive, the duration of portion $T_1$ increases.

Also assume, that as a result of some disturbance, such as an increase in the amplitude of the AC component voltage of signal $V_{ST3}$ of FIG. 1, the duration of portion $T_1$ of FIG. 2b is longer than the required duration for correct steady state operation. As described before, the required duration of portion $T_1$ is determined by ratio RT between the average value of negative current $i_{c11}$ of FIG. 1 and that of positive current $i_{c11}$. Consequently, the average value of signal $V_M$ will gradually increase in each vertical period, causing signal $V_M$ to have, during a transient mode of operation, an average value that exceeds the average value of signal $V_{ST3}$. As long as the average value of signal $V_M$ is more positive than the average value of signal $V_{ST3}$, voltage $V_{36a}$ at terminal 36a, that is equal to signal $V_M$ at terminal 36c of amplifier 36, causes a net, or average negative current $i_{INT}$ to flow, causing the average value of voltage $V_{CINT}$ to gradually become less and less positive. When voltage $V_{CINT}$ becomes less positive, DC component voltage $V_{P1DC}$ of FIG. 2b becomes more positive. The result is that the duration decreases. This duration in which voltage $V_{P1}$ is less positive than voltage $V_{REF}$ was defined as portion $T_1$. Thus, the duration of portion $T_1$ is gradually decreased until, in steady state, portion $T_1$ attains the duration that is determined, as described before, by ratio RT between the average value of negative current $i_{c11}$ and that of positive current $i_{c11}$. By controlling DC component voltage $V_{P1DC}$ of FIG. 2b, signal $V_M$ of FIG. 1 causes the duration of portion $T_1$ of FIG. 2b to assume the required steady state length. Note, that when steady state is achieved, signal $V_M$ of FIG. 1 is, again, substantially a DC voltage that is equal to the average value of signal $V_{ST3}$.

During portion $T_1$ of FIG. 2b, the minimum parabolic level $V_{P1(MIN)}$ of voltage $V_{P1}$ occurs. At the time in which level $V_{P1(MIN)}$ occurs, the rate of change of parabolic voltage $V_{P1}$ is zero. During portion $T_1$, voltage $V_{P1}$ does not deviate significantly from the level of reference voltage $V_{REF}$, because during portion $T_1$, the parabolic waveform of voltage $V_{P1}$ changes at a slow rate of change. Such slow rate of change is caused by the fact that current $i_{INT}$ of FIG. 1 is then small. It follows that minimum level $V_{P1(MIN)}$ of parabolic voltage $V_{P1}$ of FIG. 2b that occurs during portion $T_1$ has a value that is between zero volts and the level of reference voltage $V_{REF}$ that is a small positive voltage.

In carrying out another aspect of the invention, control signal $V_M$ of FIG. 1 is automatically adjusted to the average level of signal $V_{ST3}$ to cause the average value of input current $i_{INT}$ to be zero. Advantageously, integrator 50 is capable of integrating DC signal $V_{ST3}$ without the need for using a DC blocking capacitor that may adversely affect the shape of the required parabolic waveform of voltage $V_{P1}$.

As described before, because the minimum level $V_{P1(MIN)}$ of voltage $V_{P1}$ is approximately zero volts, the minimum level of parabolic voltage $V_{P2}$ of FIG. 1 is independent of the peak-to-peak amplitude of voltage $V_{P2}$. Therefore, the raster width does not significantly change when adjusting resistor 45 to vary the amplitude of parabolic voltage $V_{P2}$.

In carrying out an additional aspect of the invention, the DC, sawtooth waveform, signal $V_{ST3}$ is direct-current coupled throughout the signal path that extends from terminal 35 of resistor $R_{INT}$ to terminal 27 in which the B+ operating voltage is developed. No DC blocking capacitor is used in such signal path that forms the parabolic component voltage of the B+ operating voltage. That no DC blocking capacitor is used is advantageous because a DC blocking capacitor at the low frequency vertical rate of signal $V_{ST3}$ may have to be of a large capacitance. Such DC blocking capacitor could disadvantageously degrade operating reliability in that the capacitor could become leaky after a period of service.

The rate of change of downramping signal $V_{ST3}$ of FIG. 2c, tracks, or follows, The downramping portion a3 of signal $V_{ST2}$ of FIG. 1, having a rate of change that gradually increases from the beginning to the end of vertical trace. Such rate of change of signal $V_{ST3}$ of FIG. 2c is preferable to a straight line downramping portion, such as an ideal sawtooth waveform, for obtaining by the integration process of integrator 50, the desirable parabolic waveform that provides east-west pincushion distortion correction.

Transistor Q2 of FIG. 1 operates also as a phase splitter. A voltage summing resistor 60 that is coupled between the emitter and collector electrodes of transistor Q2 produces at a wiper WP of resistor 60, sawtooth waveform tilt control voltage $V_T$ having magnitude and polarity that are variable by adjusting the position of wiper WP. Voltage $V_T$ is capacitively coupled to terminal 41a of amplifier 41. Varying the peak-to-peak amplitude of voltage $V_T$ has little effect on the width of the raster, because, in the vertical center of the raster, the current that flows in resistor 47 and capacitor 48 that is caused by voltage $V_T$ is zero.

What is claimed is:

1. A television apparatus, responsive to an input signal for generating therefrom a periodic parabolic output signal at a deflection related frequency, comprising:
   a source of said input signal;
   a source of a reference signal;
   first means responsive to said input signal for generating therefrom said output signal having a substantially parabolic waveform;
   second means responsive to said output signal and to said reference signal for generating therefrom a first control signal that is indicative of the magnitude of a difference therebetween, said first control signal including, in a given period of said output signal that occurs in steady state operation, both a first portion signal that is caused as a result of the difference being at a first polarity, and a second portion signal that is caused as a result of the difference being at the opposite polarity such that said first control signal varies during said given period; and
   third means responsive to said first control signal for time integrating said first control signal to generate therefrom a second control signal at a magnitude that is in accordance with a relation between one of said first and second portion signals and the other one, said second control signal being applied to said first means for maintaining said parabolic output signal that occurs during a corresponding predetermined interval of said given period of said output signal at a level that is determined in accordance with said reference signal.

2. A television apparatus according to claim 1 further comprising means for adjusting the amplitude of said output signal such that said level of said output signal that occurs during said corresponding predetermined interval of said given period remains the same after adjusting the amplitude of said output signal.

3. A television apparatus according to claim 2 wherein said adjusting means comprises a resistor having a wiper so that by changing the position of said wiper, the amplitude of said output voltage is adjusted in such a manner that said level of said output signal that occurs during said correpsonding predetermined interval of said given period remains the same after changing the position of said wiper.

4. A television apparatus according to claim 2 further comprising means responsive to said output signal for generating a deflection current in a deflection winding of a television imaging device that varies in a parabolic manner in accordance with the adjustment of the amplitude of said output signal for obtaining the required parabolic manner variation of said deflection current to provide raster distortion connection in said television imaging device, and wherein the width of the raster is related to said level of said output signal that remains the same after adjusting the amplitude of said output signal so as to enable the width of the raster to remain the same.

5. A television apparatus according to claim 1 wherein said first means comprises a capacitor and means responsive to said input signal for generating a substantially sawtooth current from said input signal that is coupled to said capacitor such that the voltage developed in said capacitor is substantially equal to the time-integral of said sawtooth current.

6. A television apparatus according to claim 1 wherein said third means is responsive to said first control signal for developing an average voltage in a capacitor that varies in accordance with the difference between said output and reference signals.

7. A television apparatus according to claim 1 wherein said second means comprises a voltage comparator that generates a pulse signal of said first control signal during said predetermined interval.

8. A television apparatus according to claim 7 wherein said third means comprises a first capacitor and means responsive to said first control signal for generating in said first capacitor said second control signal that, in steady state operation, is substantially a DC signal, said second control signal having a value that varies in accordance with the duration of said pulse.

9. A television apparatus according to claim 8 wherein said first means comprises a second capacitor for developing a first parabolic waveform in said second capacitor and wherein said second control signal is coupled to said second capacitor for controlling the average voltage in said second capacitor in accordance with the relative durations of said first and second portion signals of said first control signal.

10. A television apparatus according to claim 1 wherein said first control signal generating means includes means for generating a pulse in said predetermined interval that includes an instant in which the rate of change of said parabolic output signal is zero.

11. A television apparatus according to claim 10 wherein said parabolic output signal changes relatively little during said pulse.

12. A television apparatus according to claim 11, wherein said output signal includes a DC component voltage, and further comprising means for varying said DC component voltage so as to vary in accordance therewith the duration of said pulse.

13. A television apparatus according to claim 1 wherein said first means comprises an amplifier and an integrating capacitor, and said second means comprises a comparator for generating a pulse voltage, and wherein said third means is responsive to said pulse voltage for generating said second control signal that is applied to an input terminal of said amplifier in a negative feedback manner.

14. A television deflection apparatus for generating a deflection current in a deflection winding at a first deflection frequency to produce a raster in a television imaging device, comprising:
   a deflection circuit output stage for generating a periodic deflection current in said deflection winding at said first deflection frequency, said deflection current that occurs during scanning of a center of the raster having an amplitude that determines the width of the raster;
   means coupled to said output stage for producing a periodic parabolic voltage at a second frequency having an adjustable amplitude that modulates the amplitude of said deflection current in a parabolic manner in accordance with said parabolic voltage, said parabolic voltage including a portion that determines the width of the raster;
   a source of a reference signal;
   means responsive to said portion of said parabolic voltage that determines the width of the raster and to said reference signal for generating a control signal, in accordance with a difference therebetween, that is applied to said parabolic voltage producing means to control, in accordance with said reference signal, a level of said portion that determines the width of the raster; and means for adjusting the amplitude of said parabolic voltage in such a way that after an adjustment of the amplitude of said parabolic voltage, the amplitude of said deflection current that occurs during scanning of said predetermined portion of the raster is not affected so as to maintain the width of the raster unchanged by said adjustment.

15. An apparatus according to claim 1 wherein said output signal changes in accordance with a duration of said first portion signal relative to that of said second portion signal of said first control signal.

16. An apparatus according to claim 15 wherein said first and second portions of said first control signal define a rectangular waveform, such that a change in said output signal causes a corresponding change in a duty cycle of said rectangular waveform.

17. An apparatus according to claim 16 wherein said change in said output signal from a first steady state amplitude thereof to a second steady amplitude thereof causes the duty cycle of said control signal to change in only a transient manner.

18. An apparatus according to claim 1 wherein said first means comprises an integrator responsive to said input signal for time-integrating said input signal to produce a said output signal.

19. An apparatus according to claim 18 wherein said input signal has a sawtooth waveform.

20. A television apparatus according to claim 1 wherein said first control signal is applied to said first means for maintaining a portion of said parabolic output signal that occurs during a corresponding predetermined interval of a given period of said output signal at a level that is determined in accordance with said reference signal such that when a change occurs in an average value of said input signal from a first to a second steady state value, said first control signal prevents said level of said output signal that occurs during said predetermined interval from being substantially affected.

* * * * *